(12) United States Patent
Lee

(10) Patent No.: US 6,368,927 B1
(45) Date of Patent: Apr. 9, 2002

(54) METHOD OF MANUFACTURING TRANSISTOR HAVING ELEVATED SOURCE AND DRAIN REGIONS

(75) Inventor: Jung Ho Lee, Seoul (KR)

(73) Assignee: Hyunadi Electronics Industries, Ltd., Ichon-shi (CN)

( * ) Notice: Subject to any disclaimer, the term of this patent is extended or adjusted under 35 U.S.C. 154(b) by 0 days.

(21) Appl. No.: 09/608,064

(22) Filed: Jun. 29, 2000

(30) Foreign Application Priority Data

Jun. 29, 1999 (KR) .............................. 99-25429

(51) Int. Cl.$^7$ ............................ H01L 21/336
(52) U.S. Cl. ...................... 438/300; 438/231
(58) Field of Search ............... 438/300, 231, 438/FOR 185, FOR 249

(56) References Cited

U.S. PATENT DOCUMENTS

| | | |
|---|---|---|
| 4,738,937 A | 4/1988 | Parsons |
| 4,823,174 A * | 4/1989 | Itoh et al. |
| 4,918,029 A | 4/1990 | Kim |
| 5,004,702 A | 4/1991 | Samata et al. |
| 5,030,583 A | 7/1991 | Beetz, Jr. |
| 5,032,538 A | 7/1991 | Bozler et al. |
| 5,045,494 A | 9/1991 | Choi et al. |
| 5,272,109 A | 12/1993 | Motoda |
| 5,322,802 A | 6/1994 | Baliga et al. |
| 5,322,814 A | 6/1994 | Rouse et al. |
| 5,378,652 A | 1/1995 | Samata et al. |
| 5,432,121 A | 7/1995 | Chan et al. |
| 5,435,856 A | 7/1995 | Rouse et al. |
| 5,494,837 A | 2/1996 | Subramanian et al. |
| 5,508,225 A | 4/1996 | Kadoiwa |
| 5,567,652 A | 10/1996 | Nishio |
| 5,599,724 A | 2/1997 | Yoshida |
| 5,627,102 A | 5/1997 | Shinriki et al. |
| 5,633,201 A | 5/1997 | Choi |
| 5,677,214 A * | 10/1997 | Hsu |

(List continued on next page.)

FOREIGN PATENT DOCUMENTS

| | | | |
|---|---|---|---|
| EP | 83716 A | * | 7/1983 |
| EP | 515093 A1 | * | 5/1991 |
| JP | 54-158880 | | 12/1979 |
| JP | 362291176 A | * | 12/1987 |
| JP | 2-37745 | | 2/1990 |
| JP | 2-260667 | | 10/1990 |
| JP | 3280551 | * | 12/1991 |
| JP | 8-236728 | | 9/1996 |
| JP | 780907 A2 | * | 6/1997 |
| JP | 10-107219 | | 4/1998 |
| JP | 10335660 A | * | 12/1998 |
| JP | 11-97519 | | 4/1999 |

OTHER PUBLICATIONS

Wolf, S., "Silicon Processing for the VLSI Era: vol. 2, Process Integration" Lattice Press, pp. 154–161 and 443–447, 1990.*

Primary Examiner—George Fourson
Assistant Examiner—Thanh Pham
(74) Attorney, Agent, or Firm—Townsend and Townsend and Crew LLP

(57) ABSTRACT

A method of manufacturing a transistor having an elevated drain in a substrate includes the steps of: forming a gate structure on the substrate; providing a first doped region adjacent to one end of the gate structure, the first doped region having a first dopant concentration level; forming a second doped region overlying the first doped region, the second doped region having a second dopant concentration level; and forming a third doped region overlying the second doped region, the third doped region having a third dopant concentration level different from the second dopant concentration level, in which the elevated drain includes the third doped region, where the second dopant concentration level is lower than the third concentration level.

17 Claims, 3 Drawing Sheets

U.S. PATENT DOCUMENTS

| | | | |
|---|---|---|---|
| 5,683,924 A | * | 11/1997 | Chan et al. |
| 5,693,974 A | * | 12/1997 | Hsu et al. |
| 5,744,377 A | | 4/1998 | Sekiguchi et al. |
| 5,773,350 A | | 6/1998 | Herbert et al. |
| 5,804,470 A | | 9/1998 | Wollesen |
| 5,831,334 A | * | 11/1998 | Prall et al. |
| 6,200,867 B1 | * | 11/1998 | Chen |
| 6,083,836 A | * | 12/1998 | Rodder |
| 6,218,711 B1 | * | 2/1999 | Yu |
| 6,190,977 B1 | * | 4/1999 | Wu |
| 6,156,613 A | * | 5/1999 | Wu |
| 6,167,642 B1 | * | 6/1999 | Yu et al. |
| 6,171,910 B1 | * | 7/1999 | Hobbs et al. |
| 5,953,605 A | | 9/1999 | Kodama |
| 5,970,351 A | * | 10/1999 | Takeuchi |
| 6,057,200 A | | 5/2000 | Prall et al. |
| 6,091,117 A | * | 7/2000 | Shiozawa et al. |
| 6,137,149 A | * | 10/2000 | Kodama |

* cited by examiner

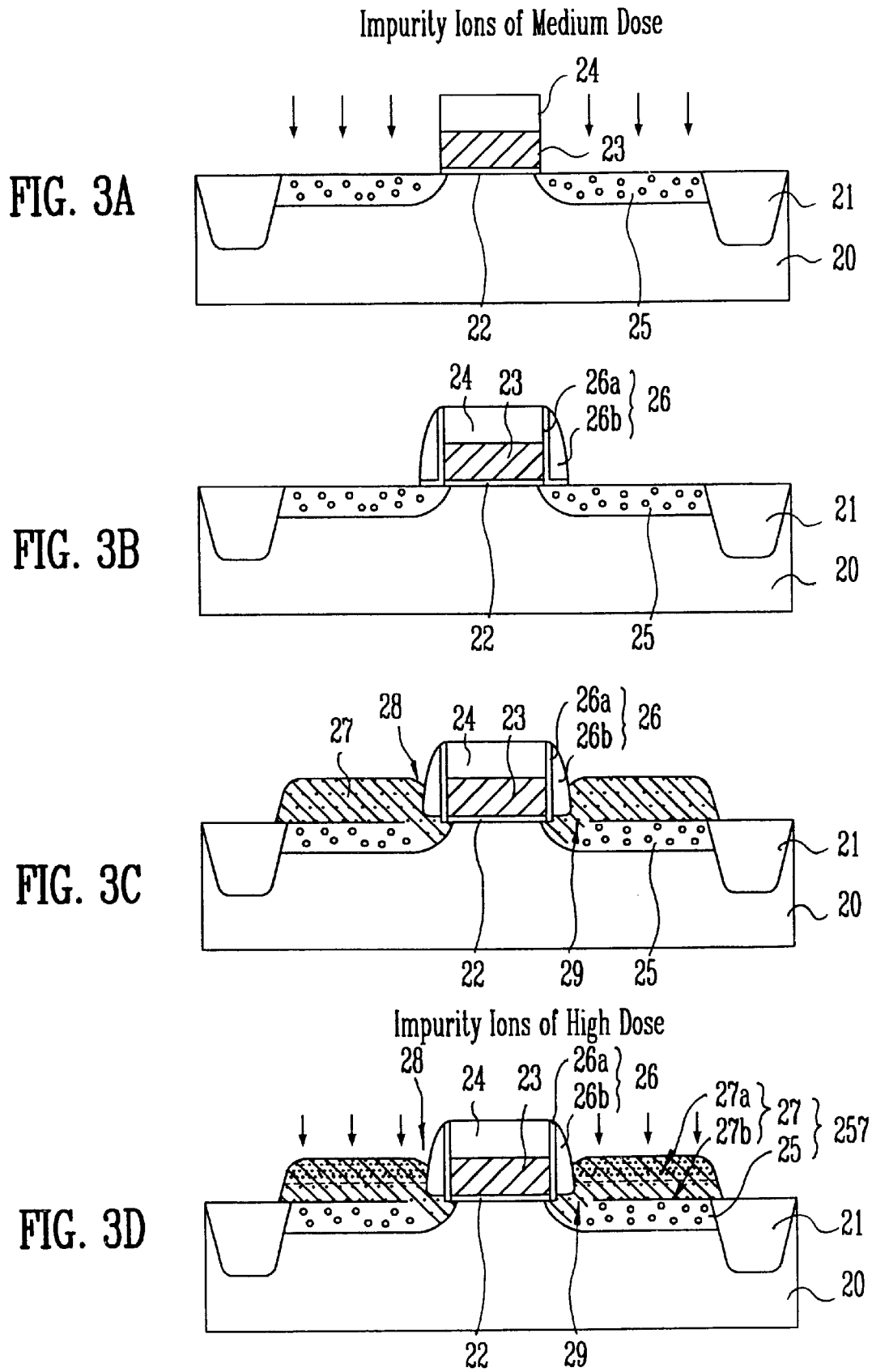

METHOD OF MANUFACTURING TRANSISTOR HAVING ELEVATED SOURCE AND DRAIN REGIONS

This application claims priority from Korean Patent Application No. 99-25429, filed on Jun. 29, 1999.

BACKGROUND OF THE INVENTION

Field of the Invention

The invention relates to a method of fabricating a semiconductor substrate, and more particularly to manufacturing a transistor having elevated source and drain regions.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths typically greater than 2 microns) to short-channel devices (i.e., channel lengths typically less than 2 microns).

As field effect transistor channel lengths (i.e., gate widths) became smaller than about 3 microns, so-called short channel effects began to become increasingly significant. As a result, device design and consequently process technology have to be modified to take these effects into account so that optimum device performance could continue to be obtained. For example, as device dimensions are reduced and the supply voltage remains constant, the lateral electric field generated within the substrate increases. If the field becomes strong enough, it can give rise to so-called hot-carrier effects. Hot-carrier effects cause unacceptable performance degradation in n-type transistor devices built with conventional drain structures if their channel lengths are less than 2 microns.

A preferred method of overcoming this problem is to provide lightly doped drain "(LDD)" regions within the substrate relative to the channel region in advance of the source and drain regions. The LDD regions are provided to be doped lighter than the source and drain regions. This facilitates sharing of the voltage drop by the drain in the channel, as opposed to the stark voltage drop at the channel occurring in non-LDD n-type transistors. The LDD regions absorb some of the voltage drop potential into the drain, thus reducing hot carrier effects. As a result, the stability of the device is increased.

However, further shrinking of the gate width (i.e., shorter channel length) makes the LDD region of a conventional transistor less effective. For example, shorter channel lengths require the LDD length to be reduced to ensure sufficient semiconductive material between the diffusion regions to prevent conductance when the gate voltage is off. One way of attending to such problems is to displace the predominant portion of the source and drain regions outwardly away from the substrate by elevating them. For example, a thin (e.g., 200 nm) epitaxial layer of monocrystalline silicon can be selectively grown from exposed monocrystalline source and drain substrate areas within an epi reactor, and provided with sufficiently high conductivity doping to effectively provide source and drain regions. The lighter doped LDD regions can be provided within the substrate immediately below the elevated source and drain. Thus, a channel of sufficient length is effectively provided despite the smaller width gate. The resulting transistor has significantly reduced short channel effects.

FIGS. 1A to 1D are cross-sectional views for explaining a conventional method of manufacturing transistors having elevated drain and source regions. Referring to FIG. 1A, a field oxide isolation structure 11 is formed on a silicon substrate 10 to define active and inactive regions. A gate structure having a gate oxide film 12, a gate electrode 13 and a mask insulating film 14 are formed on a portion of the silicon substrate 10 within the active region. Lightly doped regions 15 are formed within the silicon substrate 10 by an ion implantation step. A double gate spacer 16 having an oxide film 16a and a nitride oxide film 16b formed (FIG. 1B). An epitaxial silicon layer 17 is selectively grown on the exposed portion of the silicon substrate 10 using a chemical vapor depositon process without doping (FIG. 1C). The epitaxial silicon layer 17 grows at slower rate at a location adjacent to the double gate spacer 16 than elsewhere. As a result, a large facet 18 is formed at a junction where of the epitaxial silicon layer 17 meets the double gate spacer 16. While the facet 18 is being formed, a self-aligned epitaxial silicon sliver (SESS) 19 is formed below the double gate spacer 16. An ion implantation step is performed to heavily dope the silicon layer 17 (FIG. 1D). Thereafter, an annealing process is performed to activate the ion injected into the silicon layer 17, thereby completing the formation of the source and drain regions.

Referring to FIG. 2, the conventional transistor thus fabricated may have a portion of the lightly doped region 15, below the gate spacer 16 and adjacent to the channel, extend deeper into the substrate than the desired depth. This results since when the ion implantation step is performed to dope the epitaxial silicon layer 17, the ions being injected into the silicon layer 17 via the facet 18 are generally driven further into the silicon layer 17 than the ions in other region. Therefore, the large facet 18 may contribute to deterioration of the short channel characteristic and the hot carrier suppression capability of the transistors. In addition, during the annealing process, a significant number of the impurity ions may diffuse into the self-aligned epitaxial silicon sliver 19, which would result in lose of some of the benefits of having the lightly doped region 15 interface between the heavily doped silicon layer 17 and the channel.

One method used to solve the above problem bas been to planarize the silicon layer 17 to remove the facet 18 and also to restructure junction structure to decrease hot carrier effects. However, such a solution becomes difficult to apply as the device shrinks to 0.13 micron and smaller.

SUMMARY OF THE INVENTION

In one embodiment, a method of manufacturing a transistor having an elevated drain in a substrate includes forming a gate structure on the substrate. A first doped region adjacent to one end of the gate structure is provided, the first doped region having a first dopant concentration level. A second doped region overlying the first doped region is formed, the second doped region having a second dopant concentration level. A third doped region overlying the second doped region is formed, the third doped region having a third dopant concentration level different from the second dopant concentration level.

BRIEF DESCRIPTION OF THE DRAWINGS

FIGS. 3A to 3D are cross-sectional views for illustrating a method of manufacturing transistors according one embodiment of the present invention.

DETAILED DESCRIPTION OF PREFERRED EMBODIMENTS

Figure 1A:
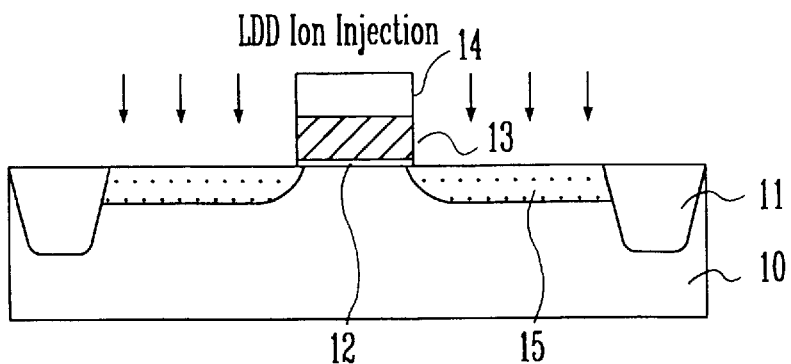
FIGS. 1A to 1D are cross-sectional views for illustrating a conventional method of manufacturing transistors.
Figure 1B:
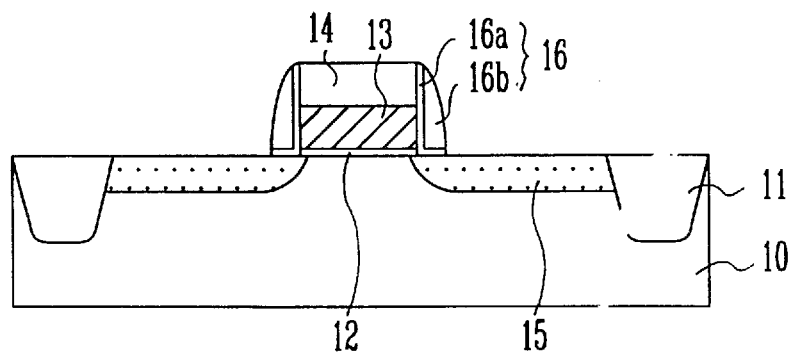
Figure 1C:
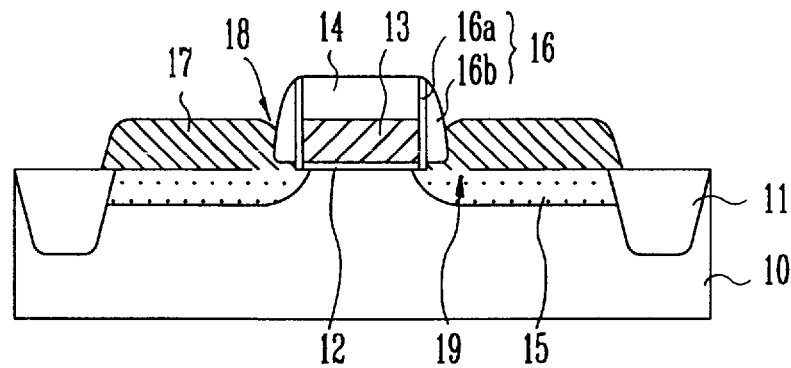
Figure 1D:
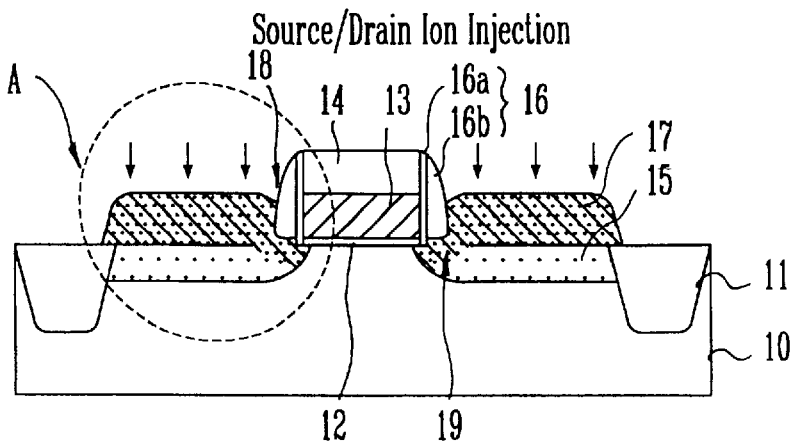
Figure 2:
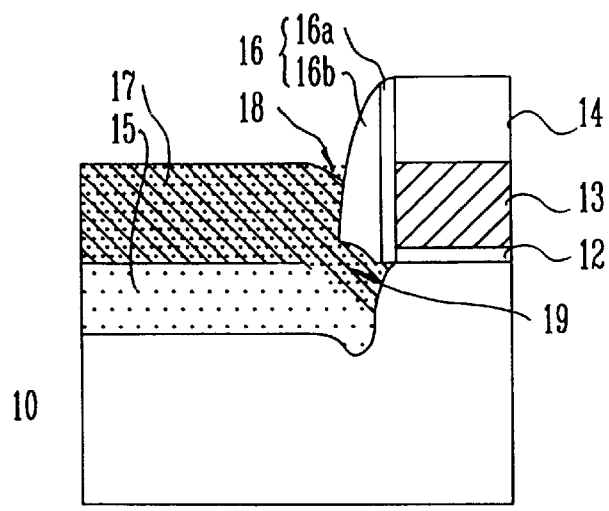
FIG. 2 is an enlarged view of a portion "A" shown in FIG. 1D.

FIGS. 3A to 3D illustrate a method for manufacturing a transistor having elevated source and drain regions according to one embodiment of the present invention. Referring now to FIG. 3A, a field oxide isolation structure 21 is formed on a silicon substrate 20 to define an active region and an inactive region. A gate structure formed on the active region includes a gate oxide film 22 provided on the silicon substrate, a gate electrode 23 overlying the gate oxide film, and then a mask insulating film 24 overlying the gate electrode.

Next, mediumly doped regions 25 are formed in the substrate 20 adjacent the ends of the gate structure. In one embodiment, for this purpose, an ion implantation step is conducted at low energy. For example, to manufacture NMOS transistors, arsenic ions are injected into the desired regions of the substrate at low energy of about 5 KeV to about 10 KeV. The ion implantation is conducted until the targeted regions reach impurity concentration between about $10^{14}/cm^3$ to about $7 \times 10^{12} \, cm^3$ to form the mediumly doped regions 25. A junction depth of the regions 25 are provided to be about 600 Å. In different implementations, different recipes may be used. For example, if the ion implantation is conducted with ions other than arsenic ions, different energy levels, different impurity concentration, different junction depth, or a combination thereof may be necessary.

Referring to FIG. 3B, after the mediumly doped regions 25 have been formed, an oxide film 26a and a nitride film 26b are sequentially deposited over the substrate, each film having a thickness of about 100 Å to about 300 Å. Normally, it is desirable that the oxide film 26a is formed with thickness of 100 to 200 Å while the nitride film 26b is formed with thikness of 200 to 300 Å. Thereafter, the oxide and nitride films are selectively removed to form a double gate spacer 26. Blank et dry etching is generally used to selectively removing those films and form the gate spacer 26.

Referring to FIG. 3C, forming a lightly doped silicon layer 27 first involves removal of a native oxide film (not shown) on the substrate. According to one embodiment, the native oxide film is removed using an ex-situ cleaning method which involves removing the substrate from the chamber, dipping the substrate into a cleaning solvent, such as HF, and performing a RCA or UV ozone cleaning. Thereafter, the substrate is reinserted into the chamber. The substrate is baked in a hydrogen atmosphere, i.e., a hydrogen bake, is performed at temperature between about 800 and 900° C. for one to five minutes to prevent oxide growth on the substrate. The ex-situ cleaning method and hydrogen bake are controlled to remove a selected portion of the oxide film 26a that is underlying the nitride film 26a, thereby forming an undercut beneath the nitride film. The undercut stops about 100 Å from an end of the gate oxide film 22.

After the hydrogen bake, the lightly doped silicon layer or lightly doped epitaxial silicon layer 27 is formed overlying the mediumly doped regions 25. In one embodiment, the lightly doped silicon layer 27 is formed by selectively growing an epitaxial layer on the exposed portion of the silicon substrate 20 using a low pressure chemical vapor deposition ("LPCVD") method. The process recipe for the LPCVD process includes flowing into the chamber about 30 sccm to about 300 sccm of dichlorsilane(DCS; $SiH_2Cl_2$), about 30 sccm to about 200 sccm of HCl, and about 100 sccm to about 300 sccm of phospine for doping. The chamber is maintained at a pressure between about 10 torr to about 50 torr and at a temperature between about 750° C. and 950° C. The deposition process is performed for about 10 minutes to provide the lightly doped epitaxial silicon layer 27 having a thickness between about 500 Å and 2000 Å.

As shown in FIG. 3C, the growth of the epitaxial silicon layer 27 adjacent to the double gate spacer 26 is slower than other areas. As a result, a facet 28 is formed at the surface of the epitaxial silicon layer 27 adjacent the double gate spacer 26. However, the facet 28 is significantly smaller than the facet 18 formed under the conventional method because, under the present embodiment, a lightly doped epitaxial silicon layer, i.e., a self-aligned epitaxial silicon sliver 29("SESS"), is grown within the undercut during the LPCVD method. This lightly doped SESS 29 contributes to reducing the size of the facet 28 because first, oxide/nitride thickness ratio increases up to about ⅔ compared to about ¼ for conventional SESS, and second, lightly doped selectively epigrowth is also effective to minimize facets to slower growth rate. Generally, the size of the facet 28 is less than 100 Å according to one embodiment of the invention.

Referring now to FIG. 3D, an ion implantation step is performed to form heavily doped regions 27a on the epitaxial silicon layer 27. In one embodiment, to manufacture NMOS transistors, the ion implantation step includes injecting arsenic ions into the epitaxial silicon layer at low energy of about 5 KeV to about 10 KeV, i.e., into the depth of about 300 Å. The energy level is selected so that the ions are not driven too far into the epitaxial silicon layer, so that the lower portion of the epitaxial silicon layer remains lightly doped. The ion implantation is conducted until the targeted regions reach an impurity concentration level between about $10^{15}/cm^3$ and $5 \times 10^{15}/cm^3$. After the desired impurity concentration level has been reached, an annealing process is performed for a predetermined time to activate the ions injected into the epitaxial silicon layer and form the heavily doped regions 27a having the thickness of about ½ of the epitaxial silicon layer. The thickness below ½ remains lightly doped.

In one embodiment, the heavily doped regions 27a and the lightly doped regions 27b may be formed without ion implantation step. For example, these regions may be formed by performing a first CVD method to grow the lightly doped region 27b and then switching to a second CVD method to grow the heavily doped regions 27a.

Referring back to the above embodiment, the annealing process is controlled so that the upper portion of the epitaxial silicon layer 27 becomes heavily doped while the lower portion remains lightly doped. In one embodiment, when the annealing process is performed in a reactive furnace, the annealing is performed in a nitrogen atmosphere at a temperature between about 800° C. to about 950° C. for about 10 to 30 minutes. In another embodiment, when the annealing process is performed in a rapid thermal annealing furnace, the annealing is performed in an atmosphere containing $N_2$ at a temperature between about 900° C. and about 1050° C. for about 1 to 30 seconds, where the temperature is increased in increments of about 30 to 200° C. per second.

From the above process, a transistor having elevated source and drain regions with junctions 257 are formed. The junction 257 includes the mediumly doped regions 25, the lightly doped regions 27b, and the heavily doped layers 27a stacked in sequence.

Figure 4:
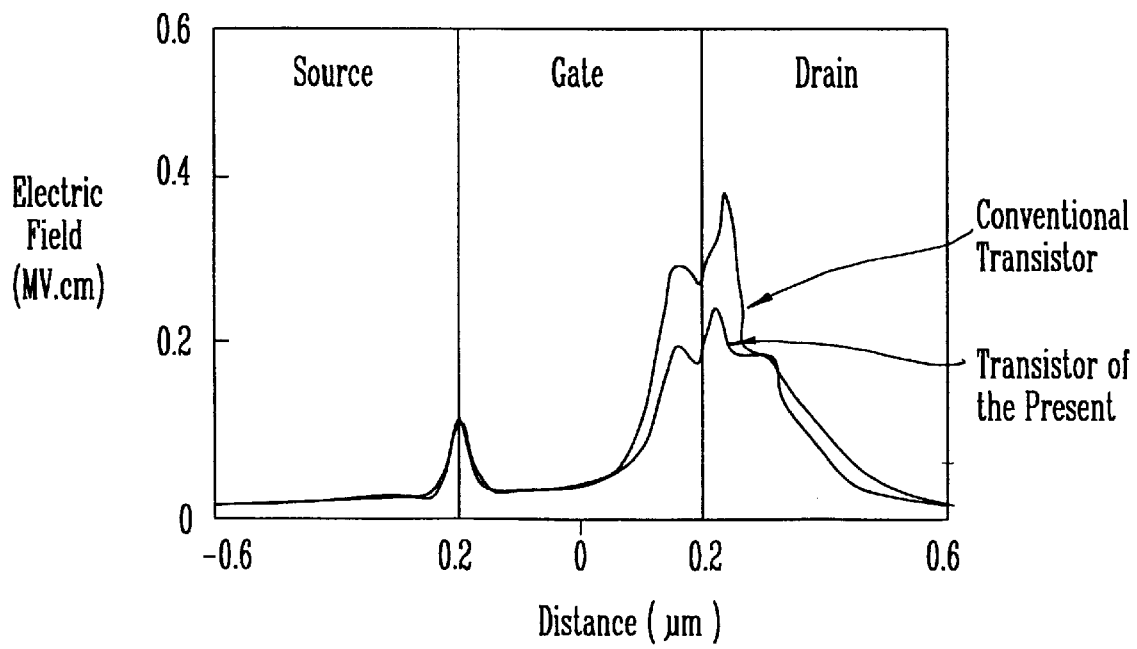
FIG. 4 shows graphs comparing the electrical crowded phenomena for the conventional transistors and the transistor fabricated according to one embodiment of the present invention.

FIG. 4 compares the electrical crowded phenomena for the conventional transistors and the transistors formed according to methods described above ("new transistors"). The x-axis shows the distance from the center of the gate, and the y-axis shows the strength of electrical field. As shown, spikes in the electrical field are observed near the gate and drain junction for both the conventional transistors and the new transistors. However, the new transistors generally have spikes that are lower in magnitude than those of the conventional transistors. As a result, the new transistors suppress the hot carriers more effectively and reduce the short channel threshold voltage roll-off. These benefits are believed to derive from forming the self-aligned epitaxial silicon sliver 29 that is lightly doped and minimizing the facet formation.

While the above is a full description of the specific embodiments, various modification, alternative constructions and equivalent may be used. Therefore, the above description and illustrations should not be taken as limiting the scope of the present invention which is defined by the appended claims.

What is claimed is:

1. A method of manufacturing a transistor having an elevated drain in a substrate, the method comprising:
   forming a gate structure on the substrate;
   providing a first doped region adjacent to one end of the gate structure, the first doped region having a first dopant concentration level;
   forming a second doped region overlying the first doped region, the second doped region having a second dopant concentration level; and
   forming a third doped region overlying the second doped region, the third doped region having a third dopant concentration level different from the second dopant concentration level, wherein the elevated drain includes the third doped region, where the second dopant concentration level is lower than the third concentration level.

2. The method of claim 1, wherein the first dopant concentration level is higher than the second dopant concentration level but lower than the third dopant concentration level.

3. The method of claim 1, wherein the first doped region is formed within the substrate and formed by ions implanted into the first doped region using low energy, the first dopant concentration level being $1\times10^{14}$ Cm$^3$ to $5\times10^{14}$ Cm$^3$, and the first doped region having a junction depth of about 500 Å.

4. The method of claim 1, forming the second and third dopant regions includes:
   growing an epitaxial silicon layer over the first doped region, the epitaxial silicon layer having an upper portion and a lower portion, where both the upper portion and the lower portion have the second dopant concentration level;
   injecting ions into the epitaxial silicon layer into a particular depth within the upper portion of the epitaxial silicon layer; and
   annealing the substrate to activate the injected ions to convert the upper portion of the epitaxial silicon layer into the third doped region having the third concentration level.

5. The method of claim 4, further comprising: forming a gate spacer having a first insulating layer and a second insulating layer different from the first insulating layer;
   removing a portion of the first layer to form an undercut; and
   forming a self-aligned epitaxial silicon sliver having the second dopant concentration level within the undercut.

6. The method of claim 5, wherein the annealing is controlled so that the self-aligned epitaxial silicon sliver would not have the third dopant concentration level.

7. The method of claim 5, wherein the size of the facet formed adjacent the gate spacer during the growing an-epitaxial silicon-layer is less than 100 Å.

8. The method of claim 7, wherein the first insulating film is an oxide film and the second insulating film is a nitride film, the first insulating having a thickness of about 100 Å to about 200 Å, and the second insulating film having a thickness of 200–300 Å.

9. The method of claim 5, wherein the undercut is about 100 Å laterally from the gate structure.

10. The method of claim 4, wherein the epitaxial silicon layer has a thickness between about 500 Å and about 2000 Å.

11. The method of claim 4, the growing-an-epitaxial silicon-layer step includes:
    flowing about 30 sccm to about 300 sccm of DCS, about 30 to about 200 sccm of HCl, and about 100 sccm to about 300 sccm of phosphine;
    maintaining the deposition pressure at about 10 torr to about 50 torr; and
    maintaining the deposition temperature at about 750° C. to 950° C.

12. The method of claim 4, wherein the annealing process includes:
    inserting the substrate into a reactive furnace;
    providing a nitrogen atmosphere within the furnace;
    maintaining the temperature within the furnace at about 800° C. to about 950; and
    processing the substrate inside the furnace for about 10 minutes to about 30 minutes.

13. The method of claim 4, wherein the annealing process includes:
    inserting the substrate into a rapid thermal annealing furnace;
    providing a nitrogen atmosphere within the furnace;
    maintaining the temperature within the furnace at about 900° C. to about 1050° C.; and
    processing the substrate inside the furnace for about 1 second to about 30 seconds, where the temperature is increased in an increments of about 30° C. to about 200° C. per second.

14. The method of claim 1, wherein the third dopant concentration level has an ion concentration of $1\times10^{15}$ Cm$^3$ to $5\times10^{15}$ Cm$^3$ and the third doped region has a thickness of about ½ of the epitaxial layer.

15. A method of manufacturing a transistor having an elevated source and an elevated drain in a substrate, the method comprising:
    forming a gate structure on the substrate to define a channel below the gate structure;
    forming a first doped region within the substrate and adjacent to the channel, the first doped region having a first dopant concentration level;

growing an epitaxial silicon layer having an upper portion and a lower portion overlying the first doped region, the epitaxial silicon layer having a second dopant concentration level;

injecting dopants within the upper portion of the epitaxial silicon layer to increase the dopant concentration level of the upper portion to be higher than the lower portion.

16. The method of claim 15, further comprising:

annealing the substrate to activate the ions injected within the upper portion without significatnly diffusing the injected ions into the lower portion, so that the upper portion has a third dopant concentration level which is higher than the second dopant concentration level of the lower portion.

17. The method of claim 16, further comprising:

providing a gate spacer adjacent to the gate structure; and forming a self-aligned epitaxial silicon sliver having the second dopant concentration level beneath the gate spacer.

* * * * *